(12) United States Patent
Barringer et al.

(10) Patent No.: US 7,766,684 B2
(45) Date of Patent: Aug. 3, 2010

(54) CONNECTOR ACTUATION MECHANISM

(75) Inventors: Dennis R. Barringer, Wallkill, NY (US); William L. Brodsky, Binghamton, NY (US); Francesco Chiarella, Pleasant Valley, NY (US); John J. Loparco, Poughkeepsie, NY (US); Michael F. Scanlon, Poughkeepsie, NY (US); John G. Torok, Poughkeepsie, NY (US)

(73) Assignee: International Business Machines Corporation, Armonk, NJ (US)

( * ) Notice: Subject to any disclaimer, the term of this patent is extended or adjusted under 35 U.S.C. 154(b) by 225 days.

(21) Appl. No.: 12/035,595

(22) Filed: Feb. 22, 2008

(65) Prior Publication Data

US 2009/0215303 A1    Aug. 27, 2009

(51) Int. Cl.
*H01R 13/62* (2006.01)
(52) U.S. Cl. .................. 439/327; 439/372; 439/262
(58) Field of Classification Search .............. 439/327, 439/372, 260–262, 266
See application file for complete search history.

(56) References Cited

U.S. PATENT DOCUMENTS

| | | | |
|---|---|---|---|
| 5,317,481 | A | 5/1994 | Hillis et al. |
| 5,815,377 | A | 9/1998 | Lund et al. |
| 5,868,585 | A | 2/1999 | Barthel et al. |
| 5,967,824 | A | 10/1999 | Neal et al. |
| 6,115,258 | A | 9/2000 | Hoyle, Jr. et al. |
| 6,210,184 | B1 | 4/2001 | Kodama et al. |
| 6,425,706 | B1 | 7/2002 | Jalanti et al. |
| 6,667,890 | B1 | 12/2003 | Barringer et al. |
| 6,671,184 | B1 | 12/2003 | Barringer et al. |
| 6,816,383 | B2 | 11/2004 | Barringer et al. |
| 6,930,892 | B2 | 8/2005 | Barringer et al. |
| 6,971,893 | B2 | 12/2005 | Barringer et al. |
| 7,083,477 | B1 | 8/2006 | Brodsky et al. |

(Continued)

OTHER PUBLICATIONS

Canfield, Shawn, et al. "Actuation Device Having Combined Mechanisms To Match A Desired Connector Plugging Curve And Method For Actuating A Power Supply Therewith". U.S. Appl. No. 11/861,400, filed Sep. 26, 2007. Specification having 23 pages and Drawings having 5 sheets.

*Primary Examiner*—Hien Vu
(74) *Attorney, Agent, or Firm*—Cantor Colburn LLP; Geraldine Monteleone

(57) ABSTRACT

A mechanism for electrically connecting a first electronic component to a second electronic component. The mechanism includes an actuating member disposed in the first electronic component including a first connector half and an actuation screw having a head and a threaded end. The actuation screw is located in the first electronic component wherein rotation of the actuation screw urges the actuating member in a direction substantially perpendicular to an axis of the actuation screw thereby engaging the first connector half to a second connector half disposed in the second electronic component. A method for electrically connecting a first electronic component to a second electronic component includes rotating an actuation screw disposed in the first electronic component and in operable communication with an actuating member disposed in the first electronic component, the actuating member including a first connector half. The actuating member is urged in a direction substantially perpendicular to an axis of the actuation screw by the rotation of the actuation screw and the first connector half is engaged to a second connector half disposed in the second electronic component.

11 Claims, 8 Drawing Sheets

U.S. PATENT DOCUMENTS 7,127,791 B2 10/2006 Barringer et al.
2005/0243533 A1 11/2005 Malone et al.
2008/0014779 A1* 1/2008 Lee et al. .................... 439/327

* cited by examiner

CONNECTOR ACTUATION MECHANISM

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to electronic components, and particularly to connectors for electronic components.

2. Description of Background

Increasing needs for power for electronic components, for example, system processing units has led to increased volt-ampere requirements and an increase in the number of required power domains (or voltages) provided by power supplies (or Direct Current Adaptors) to the system processing units. Resulting connectors between the power supply and the system processing unit have high current ratings sometimes in the range of 1000 to 1400 amps and increasingly greater lengths to supply all of the required voltage domains while staying under the maximum allowed current per inch of card edge. These requirements all directly influence the force required to achieve connection between the power supply and the system processing unit. For example, a power supply configured to supply approximately 20 power domains with contact ratings ranging from 40 to 150 amps results in a connection force of approximately 110 lbs.

Further, as connector length has increased, difficulty in successfully engaging the connector has also increased. The increased length increases the potential for angular deflection between the two connector halves, and also potentially increases deformation of each connector half. These factors, among others require employment of an accurate mechanism for engaging the connector halves to one another.

SUMMARY OF THE INVENTION

The shortcomings of the prior art are overcome and additional advantages are provided through the provision of a mechanism for electrically connecting a first electronic component to a second electronic component. The mechanism includes an actuating member disposed in the first electronic component including a first connector half and an actuation screw having a head and a threaded end. The actuation screw is located in the first electronic component wherein rotation of the actuation screw urges the actuating member in a direction substantially perpendicular to an axis of the actuation screw thereby engaging the first connector half to a second connector half disposed in the second electronic component.

A method for electrically connecting a first electronic component to a second electronic component includes rotating an actuation screw disposed in the first electronic component and in operable communication with an actuating member disposed in the first electronic component, the actuating member including a first connector half. The actuating member is urged in a direction substantially perpendicular to an axis of the actuation screw by the rotation of the actuation screw and the first connector half is engaged to a second connector half disposed in the second electronic component.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which provides a mechanism for electrically connecting a first electrical component to a second electrical component utilizing mechanical advantage to overcome increasing engagement forces caused by the utilization of connectors of increasing length and voltage ratings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
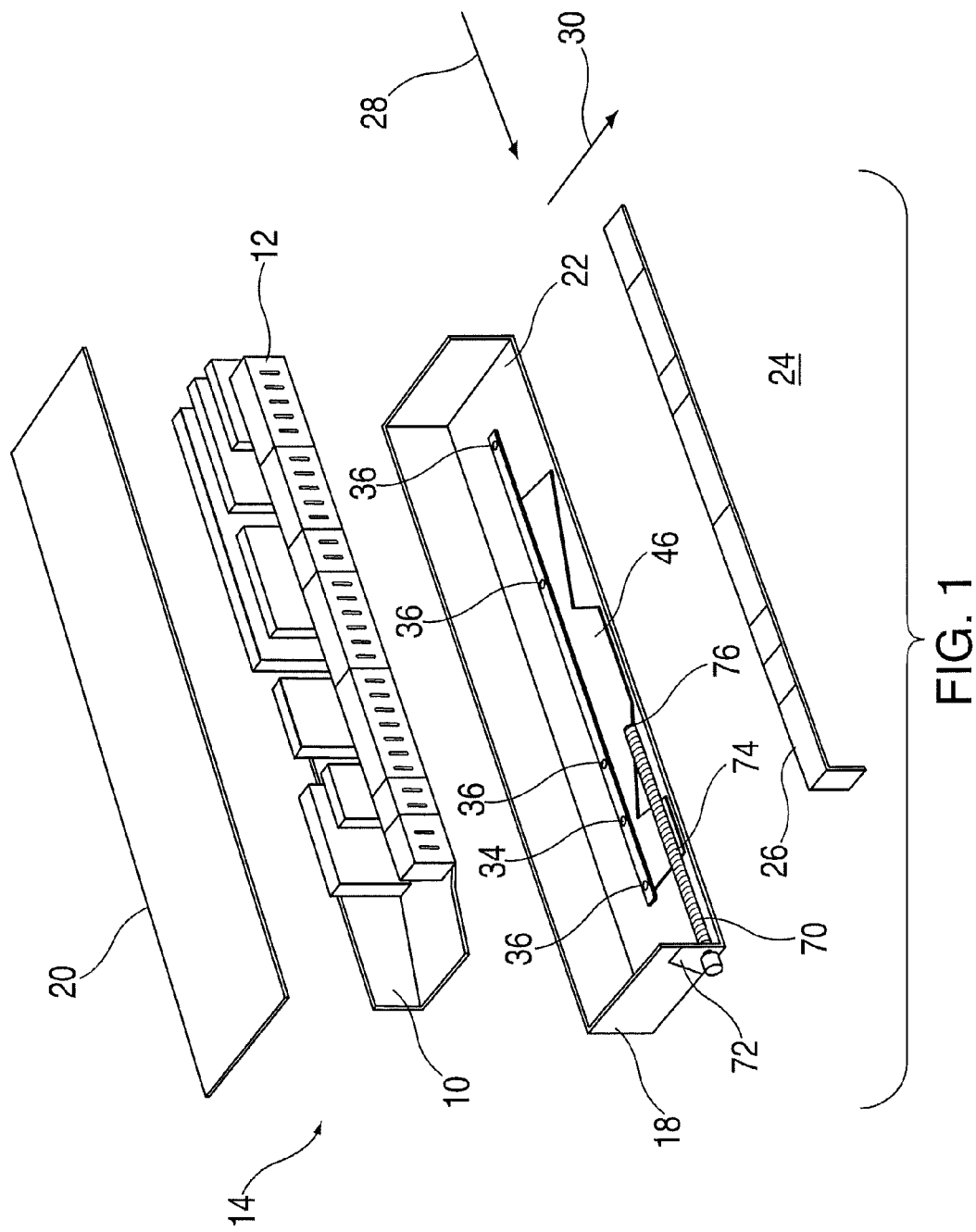
FIG. 1 is a partially exploded view of an embodiment of a direct current adapter assembly including a connector actuation mechanism.

Turning now to the drawings in greater detail, it will be seen that in FIG. 1 there is a card assembly 10 that includes at least one DCA connector 12 disposed along a length of and operably connected to the card assembly 10. The card assembly 10 is moveably disposed in an electronic component, for example, a direct current adapter (DCA) 14. The DCA 14 further includes an enclosure which in the embodiment of FIG. 1 includes a chassis assembly 18 and a cover 20 assembled thereto. The enclosure defines a connector window 22 which allows for extension of the at least one DCA connector 12 therethrough. The DCA 14 is installable into, for example, a server 24 and the at least one DCA connector 12 is connectable to at least one server connector 26. A connection between the DCA connector 12 and the server connector 26 is a blind connection wherein a direction of installation of the DCA 14 into the server 24 is substantially different from a direction of connection between the DCA connector 12 and the server connector 26. In the embodiment of FIG. 1, DCA 14 is inserted into the server 24 in an installation direction 28 and the DCA connector 12 is engaged to the server connector 26 in a connection direction 30 which is substantially perpendicular to the installation direction 28.

Figure 2:
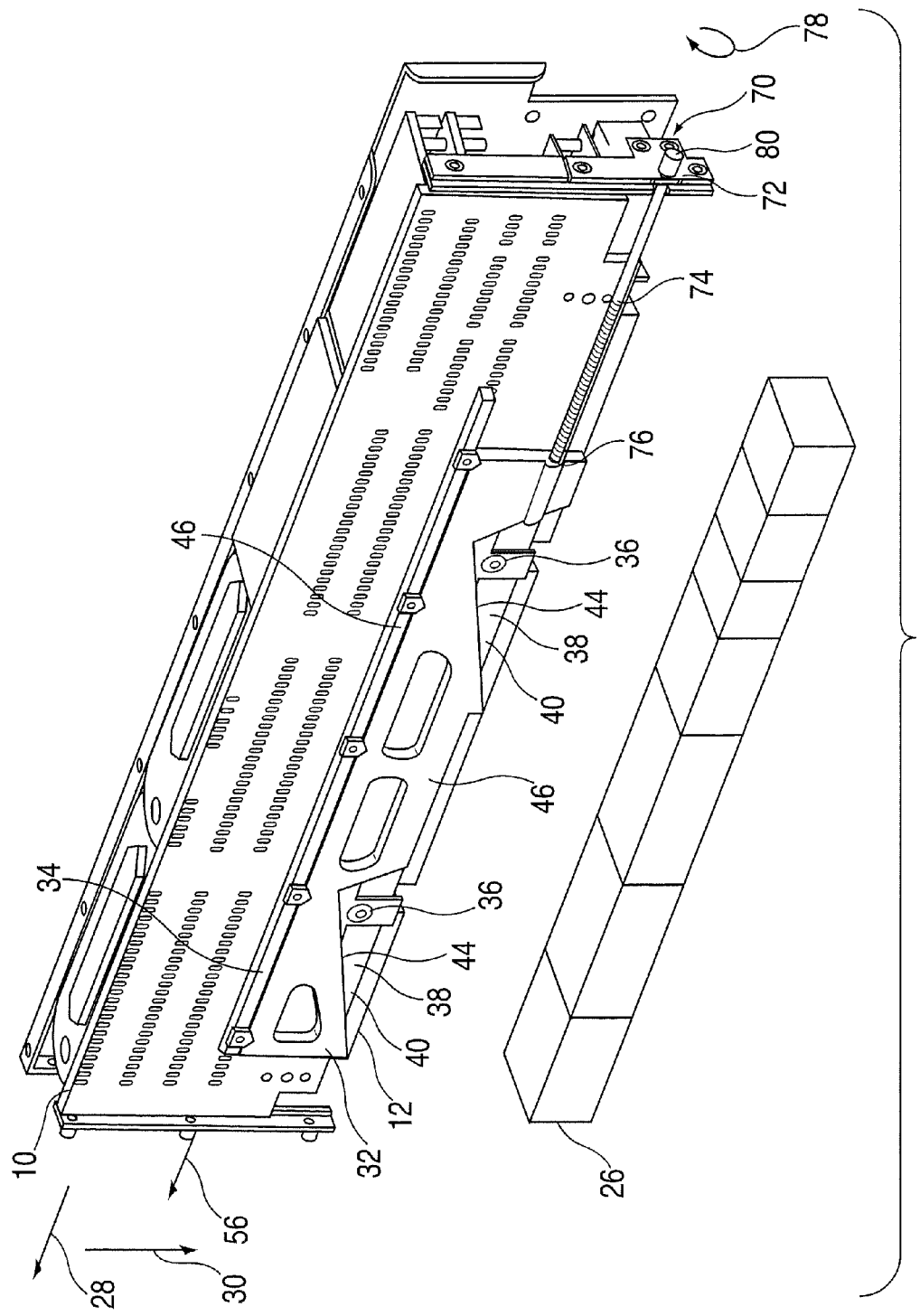
FIG. 2 is a perspective view on an embodiment of an a connector actuation mechanism installed on a card assembly of the direct current adapter of FIG. 1.
Figure 5:
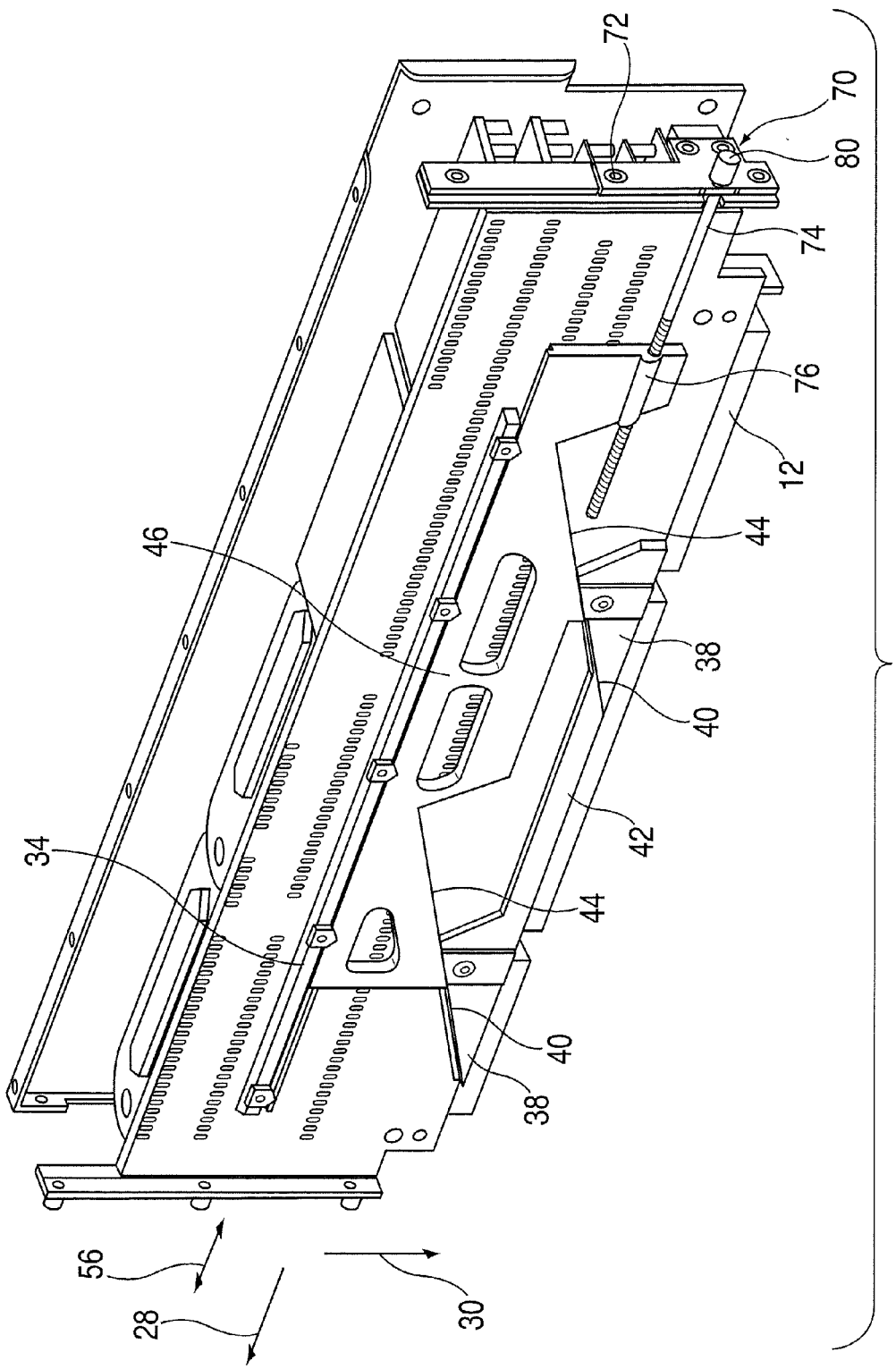
FIG. 5 is a perspective view of the assembly of FIG. 2 in an engaged position.

Referring now to FIG. 2, an actuation mechanism 32 is illustrated which is capable of moving the card assembly 10 including the DCA connector 12 in the connection direction 30 to engage the DCA connector 12 with the server connector 26. In the embodiment of the actuation mechanism 32 shown in FIG. 2, a guide bar 34 is affixed to the chassis assembly 18 by mechanical fasteners, for example, a plurality of screws 36, or other means as shown best in FIG. 1. The chassis assembly 18 is omitted from FIG. 2 merely to enable illustration of the remaining structure of the actuation mechanism 32. The guide bar 34 of the present embodiment is disposed substantially perpendicularly to the connection direction 30, but other orientations of the guide bar 34 are contemplated within the present scope. At least one driven ramp 38 is affixed to the card assembly 10, for example, to the DCA connector 12 by one or more screws 36 or other means. The embodiment of FIG. 2 includes two driven ramps 38, but other quantities of driven ramps 38 may be utilized depending on factors such as length of the DCA connector 12. Each driven includes a driven ramp edge 40 which is disposed such that it is parallel to neither of the installation direction 28 and the connection direction 30. In some embodiments, as shown in FIG. 2, each driven ramp 38 is triangular in shape and each driven ramp edge 40 is substantially parallel to each other driven ramp edge 40. Further, as shown in FIG. 5, the individual driven ramps 38 may be joined to each other by a spar 42 to integrally connect the individual driven ramps 38 into a single component.

Figure 3:
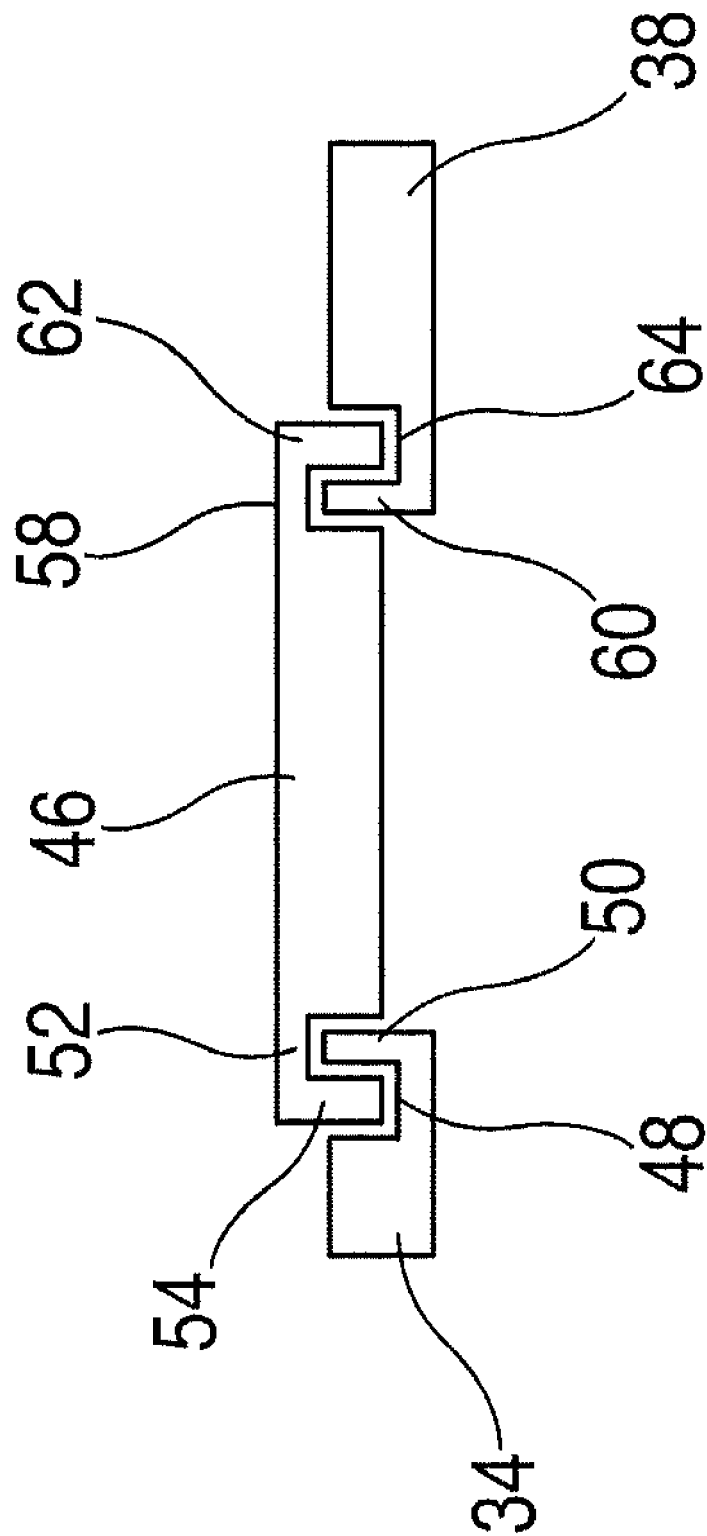
FIG. 3 is a partial cross-sectional view of the assembly of FIG. 2.

Referring again to FIG. 2, each driven ramp edge 40 abuts a drive ramp edge 44 of a drive ramp 46 which is disposed between the driven ramps 38 and the guide bar 34. The drive ramp 46 of the embodiment shown in FIG. 2 interfaces with the guide bar 34 and each driven ramp 38 by an interleaving arrangement. For example, as shown in FIG. 3, the guide bar 34 is configured with a main slot 48 extending along a length of the guide bar 34 and a main tab 50 which may extend substantially perpendicular to the main slot 48. The drive ramp 46 includes a guide slot 52 extending along a length of the drive ramp 46 which is capable of receiving the main tab 50 and a guide tab 54 which is insertable into the main slot 48 thus creating an interleaved arrangement between the guide bar 34 and the drive ramp 46 wherein the drive ramp 46 is moveable relative to the fixed guide bar 34 in a guide direction 56. As shown in FIG. 3, the drive ramp 46 also includes a drive slot 58 receivable of a driven tab 60 of the driven ramp 38, and a drive tab 62 which is insertable into a driven slot 64 of the driven ramp 38. When the drive ramp 46 is assembled to the driven ramp 38, the drive ramp 46 is movable relative to the driven ramp 38 in a drive direction 66.

Figure 4:
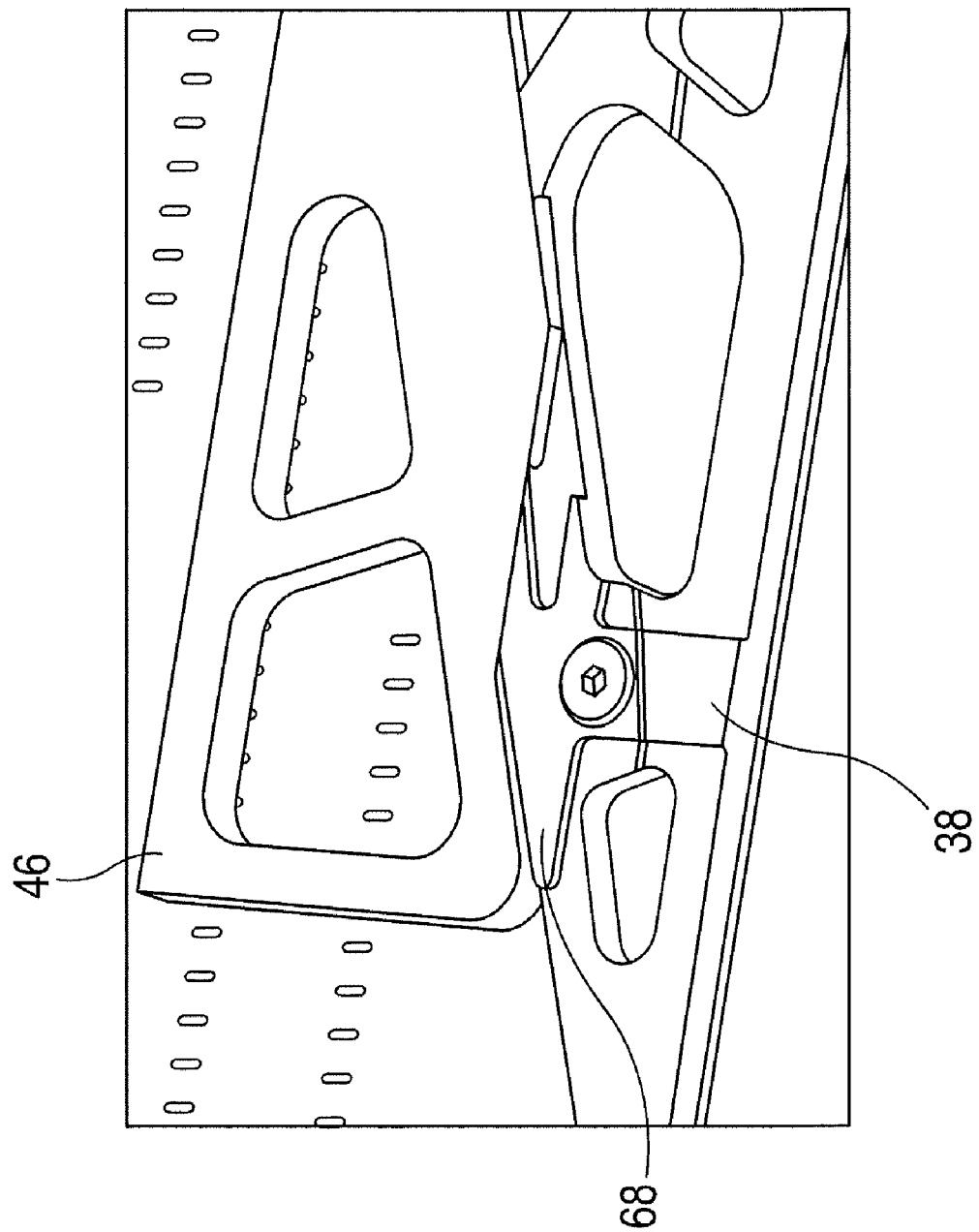
FIG. 4 is a detail view of an alternative embodiment of the assembly of FIG. 2.

In an alternative embodiment shown in FIG. 4, the drive ramp 46 and each driven ramp 38 have an interlocking interface. For example, the driven ramp 38 may include an interlocking feature 68 which prevents disengagement of the driven ramp 38 from the drive ramp 46.

Referring again to FIG. 2, an actuation screw 70 is disposed in the chassis assembly 18 and extends through the chassis assembly 18 via a screw retention bracket 72. The screw retention bracket 72 maintains the position of the actuation screw 70 in the chassis assembly 18. The actuation screw 70 includes a threaded end 74 which extends from the screw retention bracket 72 into an actuation hole 76 in the drive ramp 46. The actuation hole 76 has a threaded configuration complimentary to the actuation screw 70.

In operation, the DCA 14 is installed into the server 24 by sliding the DCA 14 into the server 24 in the installation direction 28. The actuation screw 70 is rotated in, for example, a clockwise direction as shown by arrow 78. The rotation of the actuation screw 70 in the actuation hole 76 causes the drive ramp 46 to travel along the guide direction 56 toward a head 80 of the actuation screw 70. As the drive ramp 46 moves along the guide direction 46, each drive ramp edge 44 moves along the corresponding driven ramp edge 40, urging the driven ramps 38 and therefore the card assembly 10 in the connection direction 30 until the DCA connector 12 fully engages the server connector 26 as shown in FIG. 5.

In some embodiments, low friction coatings or platings may be included in the guide bar 34, the drive ramp 46, and/or the at least one driven ramp 38, for example, to maximize a mechanical advantage provided by the actuation mechanism 32. The actuation mechanism 32 may be customized by, for example, adjusting a drive direction 66 to met requirements for connector travel and/or connection force.

Figure 6:
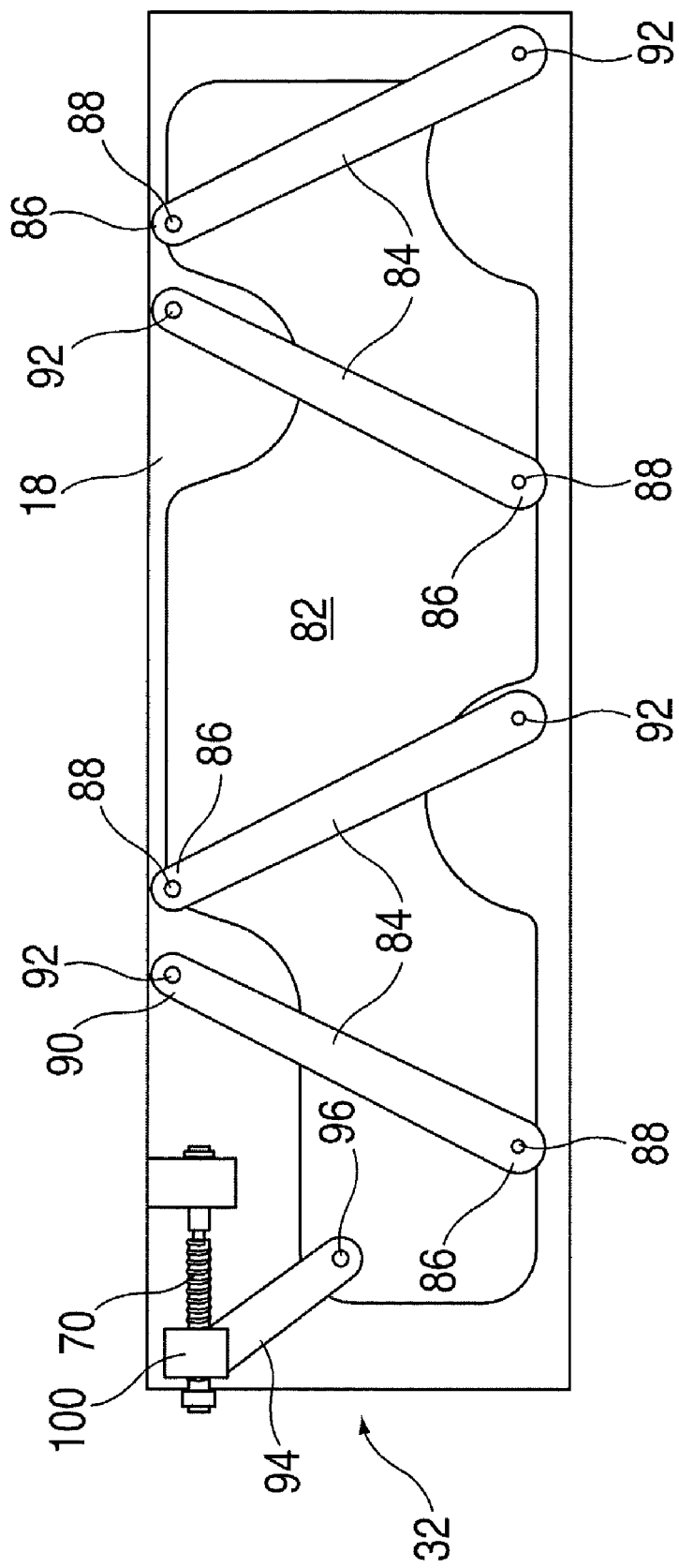
FIG. 6 is an alternative embodiment of a connector actuation mechanism.
Figure 7:
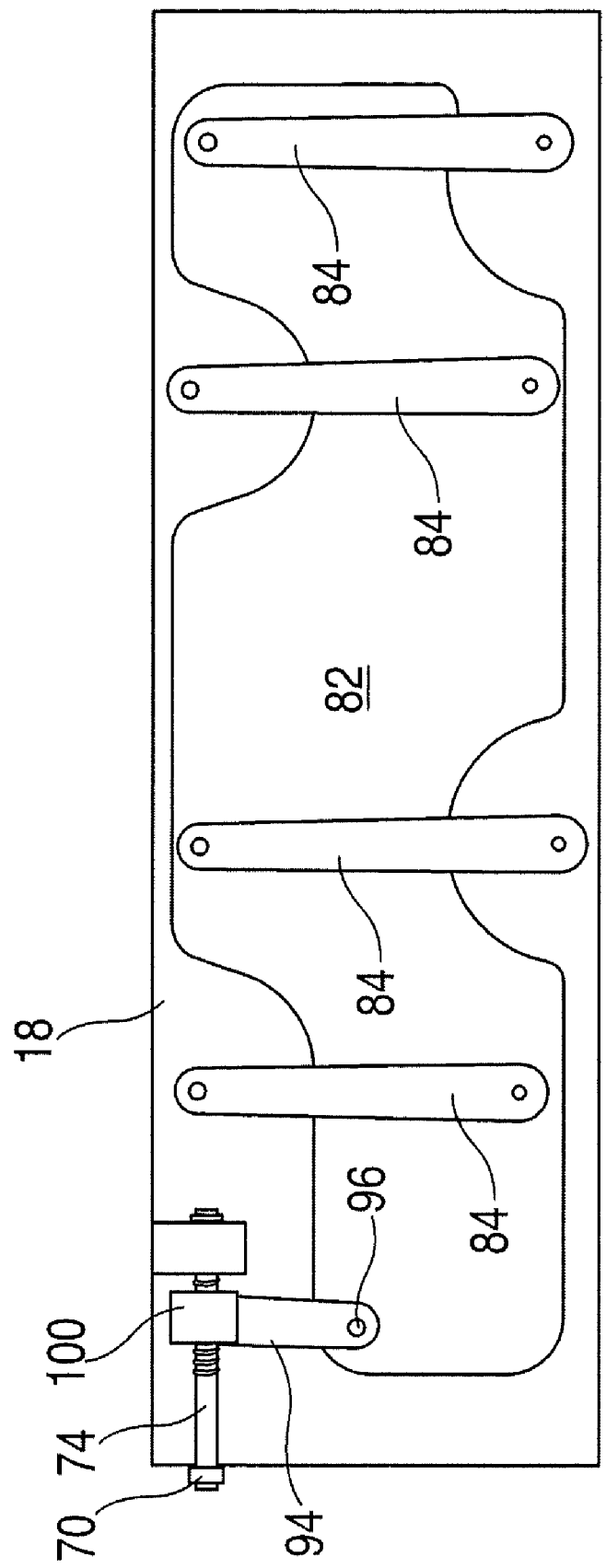
FIG. 7 illustrates the mechanism of FIG. 6 disposed in an engaged position.

An alternative embodiment of a screw-driven actuation mechanism 32 is illustrated in FIG. 6. In this embodiment, the card assembly 10 is secured to a slider plate 82. The card assembly 10 is not shown in this view so the structure of the mechanism 32 may be fully shown. A plurality of linkages 84 are each connected at a first end 86 to the slider plate 82 by a mechanical fastener, for example, a rivet 88. In the embodiment shown in FIG. 6 four linkages 84 are utilized, but other quantities of linkages 84 are contemplated within the current scope. A second end 90 of each linkage 84 is secured to the chassis assembly 18 by a mechanical fastener, for example a link screw 92. The link screws 92 allow for relative rotation between each linkage 84 and the chassis assembly 18. Similarly, each rivet 88 allows for relative rotation between each linkage 84 and the slider plate 82. The linkages 84, slider plate 82, chassis assembly 18, and connections therebetween are configured such that as the linkages 84 rotate relative to the chassis assembly 18, the slider plate is urged between a rotate, the slider plate 82 and the card assembly 10 disposed thereon is moved between a disengaged position (shown in FIG. 6) and an engaged position as illustrated in FIG. 7. Moving the card assembly 10 from a disengaged position to an engaged position thereby engages the DCA connector 12 with the server connector 26.

Figure 8:
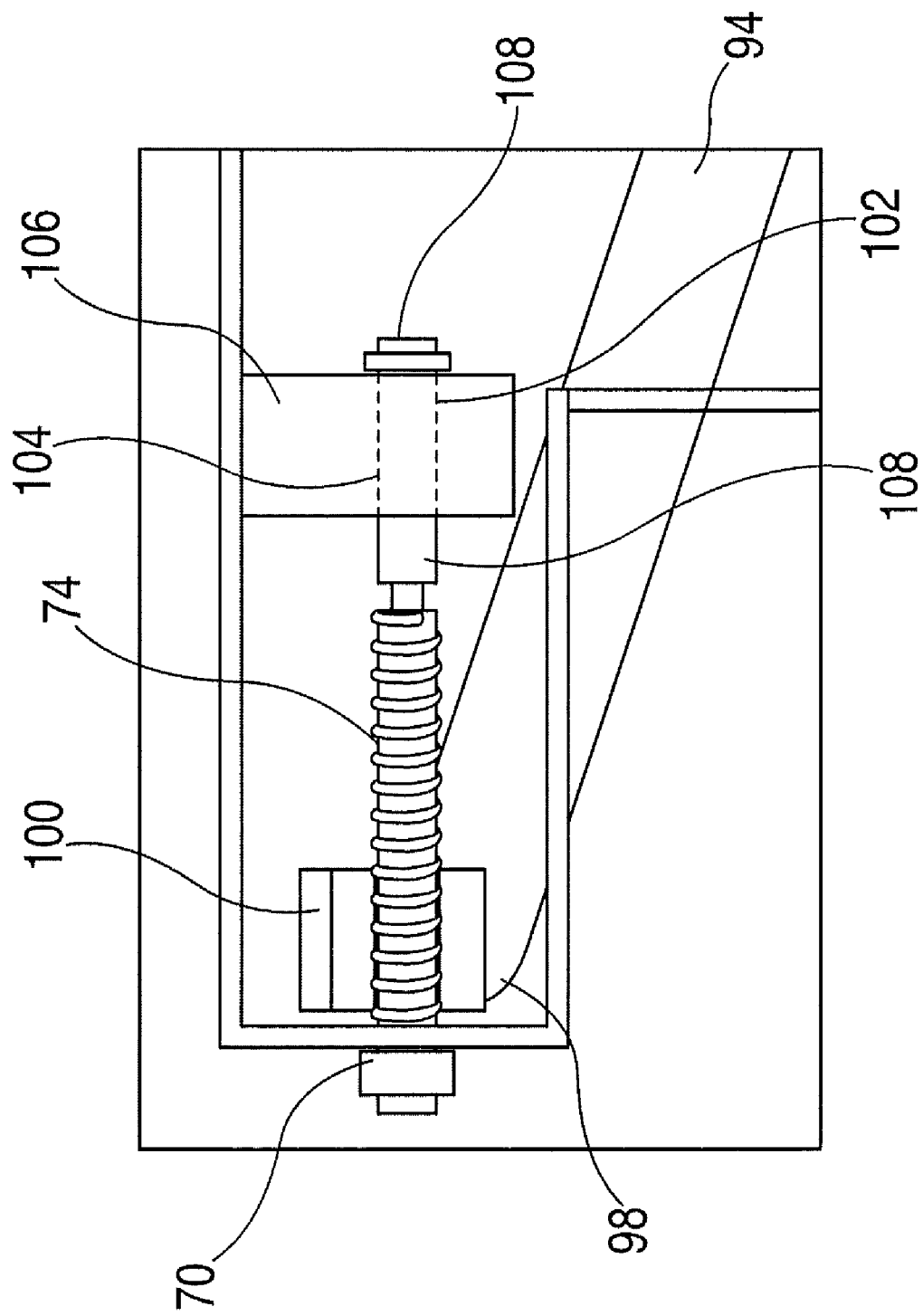
FIG. 8 illustrates an embodiment of a screw drive for the mechanism of FIG. 6.

As shown in FIG. 7, a linking arm 94 is secured at a plate end 96 to the slider plate 82 by a mechanical fastener, for example, a link screw 92. As shown in FIG. 8, the linking arm 94 is secured at a nut end 98 to a sliding nut 100. The sliding nut 100 is threaded onto the threaded end 74 of the actuation screw 70. In this embodiment, a tip 102 of the actuation screw 70 is positioned in a clearance hole 104 of a fixed guide 106 which is fixed to the chassis assembly 18. The actuation screw 70 is rotably secured in the clearance hole 104 by one or more snap rings 108 disposed on the actuation screw 70 at either or both ends of the clearance hole 104.

When it is desired to connect the DCA connector 12 with the server connector 26 in this embodiment, the actuation screw 70 is rotated, causing the sliding nut 100 to proceed away from the head 80 of the actuation screw 70. The motion of the sliding nut 100 causes rotation of the linking arm 94 which results in translation of the slider plate 82 from the disengaged position to the engaged position, thereby engaging the DCA connector 12 with the server connector 26. The DCA connector 12 may be disengaged from the server connector 26 by rotating the actuation screw 70 in an opposite direction.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A mechanism for electrically connecting a first electronic component to a second electronic component comprising:
   an actuation member disposed in the first electronic component including a first connector half; and
   an actuation screw having a head and a threaded end, the actuation screw disposed in the first electronic component wherein rotation of the actuation screw urges the actuating member in a direction substantially perpendicular to an axis of the actuation screw thereby engaging the first connector half to a second connector half disposed in the second electronic component;
   a guide bar fixed to the first electronic component;
   at least one driven ramp disposed in the first electronic component along the length of a guide bar fixed to the actuating member;
   wherein the first electronic component is a direct current adapter; and
   wherein the second electronic component is a server.

2. The mechanism of claim 1 wherein the first electronic component comprises:
   a drive ramp slidably disposed between guide bar and the at least one driven ramp, the drive ramp having a threaded connection to the threaded end of the actuation screw wherein rotation of the actuation screw is capable of urging the drive ramp slidably along a length of the guide bar and slidably along a driven ramp edge of each driven ramp of the at least one driven ramp thereby urging the actuating member in the direction substantially perpendicular to the axis of the actuation screw.

3. The mechanism of claim 2 wherein the guide bar is interleaved with the drive ramp.

4. The mechanism of claim 2 wherein the drive ramp is interleaved with the at least one driven ramp.

5. The mechanism of claim 2 wherein one or more of the guide bar, the drive ramp and the at least one driven ramp include a low-friction coating.

6. The mechanism of claim 2 wherein the at least one driven ramp is two driven ramps.

7. A method for electrically connecting a first electronic component to a second electronic component comprising:
   rotating an actuation screw disposed in the first electronic component and in operable communication with an actuating member disposed in the first electronic component, the actuating member including a first connector half;
   urging the actuating member in a direction substantially perpendicular to an axis of the threaded fastener by the rotation of the actuation screw; and
   engaging the first connector half to a second connector half disposed in the second electronic component;
   wherein urging the actuating member comprises: sliding a drive ramp disposed in the first electronic component along the length of a guide bar fixed to the first electronic component; and
   sliding at least on driven ramp secured to the actuating member in the direction substantially perpendicular to the axis of the actuation screw by the motion of the drive ramp;
   wherein the first electronic component is a direct current adapter; and
   wherein the second electronic component is a server.

8. The method of claim 7 wherein the drive ramp includes a threaded hole to operably connect the drive ramp to a threaded end of the actuation screw.

9. The method of claim 7 wherein the guide bar is interleaved with the drive ramp.

10. The method of claim 7 wherein the drive ramp is interleaved with the at least one driven ramp.

11. The method of claim 7 wherein the at least one driven ramp is two driven ramps.

* * * * *